(12) United States Patent
Wang et al.

(10) Patent No.: US 7,705,523 B2
(45) Date of Patent: Apr. 27, 2010

(54) HYBRID SOLAR NANOGENERATOR CELLS

(75) Inventors: Zhong L. Wang, Marietta, GA (US); Xudong Wang, Atlanta, GA (US)

(73) Assignee: Georgia Tech Research Corporation, Atlanta, GA (US)

( * ) Notice: Subject to any disclaimer, the term of this patent is extended or adjusted under 35 U.S.C. 154(b) by 98 days.

(21) Appl. No.: 12/194,914

(22) Filed: Aug. 20, 2008

(65) Prior Publication Data

US 2009/0295257 A1 Dec. 3, 2009

Related U.S. Application Data

(60) Provisional application No. 61/056,214, filed on May 27, 2008.

(51) Int. Cl.
H01L 41/113 (2006.01)
(52) U.S. Cl. .................. 310/339; 60/641.8
(58) Field of Classification Search ......... 310/339; 60/641.8
See application file for complete search history.

(56) References Cited

U.S. PATENT DOCUMENTS

| | | |
|---|---|---|
| 4,099,986 A | 7/1978 | Diepers |
| 4,135,950 A | 1/1979 | Rittner |
| 4,155,781 A | 5/1979 | Diepers |
| 4,352,948 A | 10/1982 | Kaplow et al. |
| 4,450,033 A | 5/1984 | Little |
| 4,748,130 A | 5/1988 | Wenham et al. |
| 6,882,051 B2 | 4/2005 | Majumdar et al. |
| 7,051,945 B2 | 5/2006 | Empedocles et al. |
| 7,262,515 B2 | 8/2007 | Pinkerton |
| 7,294,417 B2 | 11/2007 | Ren et al. |

(Continued)

FOREIGN PATENT DOCUMENTS

DE 102005029162 A1 1/2007

(Continued)

OTHER PUBLICATIONS

Jeon et al., "MEMS power generator with transverse mode thin film PCT," Science Direct, vol. 122, Issue 1, Jul. 29, 2005, pp. 16-22.

(Continued)

*Primary Examiner*—Thomas M Dougherty
(74) *Attorney, Agent, or Firm*—Bryan W. Bockhop; Bockhop & Associates, LLC (57) ABSTRACT

A dye-sensitized solar cell including ZnO nanowire arrays grown of a flat substrate for harvesting solar energy is integrated with a piezoelectric nanogenerator for harvesting ultrasonic wave energy. The two energy harvesting approaches work simultaneously or individually and can be integrated in parallel or serial for raising the output current, voltage or power, respectively. A solar cell employs an optical fiber and semiconductor nanowires grown around the fiber. A p-n junction based design, organic-inorganic heterojunction, or a dye-sensitized structure is built at the surfaces of the nanowires. Light entering the fiber from a tip propagates through the fiber until it enters a nanowire where it reaches a photovoltaic element. Light entering the fiber cannot escape until it interacts with a photovoltaic element, thereby increasing the solar conversion efficiency. The fiber can transmit light, while the nanowires around the fibers increase the surface area of light exposure.

21 Claims, 6 Drawing Sheets

U.S. PATENT DOCUMENTS

| | | | |
|---|---|---|---|
| 7,446,451 B2 * | 11/2008 | Allen et al. | 310/311 |
| 2003/0089899 A1 | 5/2003 | Lieber et al. | |
| 2003/0205657 A1 | 11/2003 | Voisin | |
| 2004/0127025 A1 | 7/2004 | Crocker, Jr. et al. | |
| 2005/0009224 A1 | 1/2005 | Yang et al. | |
| 2005/0188751 A1 | 9/2005 | Puskas | |
| 2005/0242366 A1 | 11/2005 | Parikh et al. | |
| 2006/0137741 A1 | 6/2006 | Park et al. | |
| 2007/0010702 A1 | 1/2007 | Wang et al. | |
| 2007/0111368 A1 | 5/2007 | Zhang et al. | |
| 2007/0151601 A1 | 7/2007 | Jung et al. | |
| 2008/0041446 A1 | 2/2008 | Wu et al. | |
| 2008/0067618 A1 | 3/2008 | Wang et al. | |
| 2009/0309456 A1 * | 12/2009 | Stollberg | 310/319 |

FOREIGN PATENT DOCUMENTS

| | | |
|---|---|---|
| EP | 1523019 A2 | 4/2005 |
| WO | WO-2006-046843 A1 * | 5/2006 |
| WO | 2006138671 A2 | 12/2006 |

OTHER PUBLICATIONS

Gao et al., Nanoarchitectures of semiconducting and piezoelectric zinc oxide, J. Applied Physics 97, 044304 (2005).

Wang et al., "Large-Size Liftable Inverted-Nanobowl Sheets as Reusable Masks for Nanolithography," Nano Letters, vol. 5, No. 9, 2005, 1748-1788.

Lao et al., "Formation of double-side teethed nanocombs of ZnO and self-catalysis of Zn-terminated polar surface," Chemical Physics Letters, Elsevier B.V., 2005.

Jeon et al., "MEMS power generator with transverse mode thin film PZT," Sensors and Actuators A Physical, Elsevier, (2005).

Lao et al., "Formation of double-side teethed nanocombs of ZnO and self-calalysis of Zn-terminated polar surface," Chemical Physics Letters (Science Direct), (Abstract), 2007.

Wang et al., "Large-Size Liftable Inverted-Nanobowl Sheets as REusable Masks for Nanolithography," Nano Letters, vol. 5, (Abstract), 2005.

Wang et al., "Piezoelectric Nanogenerators Based on Zinc Oxide Nanowire Arrays," Science, vol. 312, pp. 242-245, Apr. 14, 2006.

Peck-Radosavjevic et al., "Thrombopoietin induces rapid resolution of thrombocytopenia after orthotopic liver transplantation through increased platelet production," Blood, vol. 95, No. 3, (2000).

* cited by examiner

HYBRID SOLAR NANOGENERATOR CELLS

CROSS-REFERENCE TO RELATED APPLICATION(S)

This application claims the benefit of U.S. Provisional Patent Application Ser. No. 61/056,214, filed on May 27, 2008 the entirety of which is hereby incorporated herein by reference.

BACKGROUND OF THE INVENTION

1. Field of the Invention

The present invention relates to electric power generation systems and, more specifically, to a hybrid solar power and mechanical power generating system.

2. Description of the Prior Art

There are generally three different sources for scavenging energy from the environment: solar energy, thermal energy and mechanical energy (such as wind energy). Solar cells are typically used to collect solar energy and transform it into electrical energy. However, solar cells cannot produce electricity at times when there is insufficient ambient light, such as in the evening.

Mechanical energy, from large-scale winds to micro-scale vibration, is almost always available. Thus, a system for converting mechanical energy to electricity would be able to produce electricity almost anywhere at almost any time.

Recently, a ZnO nanowire-based nanogenerator that can effectively convert small scale mechanical vibration energy into electricity has been demonstrated. However, the power output of the nanogenerator was relatively low in some applications.

The highest efficiency solar cells to date (40.7%) employ optical lenses to focus light onto the photovoltaic materials. These concentrators are expensive and have therefore been limited in scalability.

Driven by the telecommunications industry, there has been a tremendous amount of research in the past two decades into fiber optic cables as a medium for transporting data in the form of light. At present, a mature infrastructure is in place for mass production of optical fibers. State-of-the-art fibers can transport light up to distances of 500-800 km with low signal attenuation owing to the physical principle of total internal reflection. Given these characteristics, fiber optic cables are potentially an ideal medium for directing light towards a photovoltaic material system for solar energy harvesting.

Therefore, there is a need for a hybrid nanogenerator that combines a highly efficient solar cell with a piezoelectric nanogenerator that can generate power continuously in a range of different and changing environments.

There is also a need for a scalable optical system which can transport the light energy to the photovoltaic elements.

SUMMARY OF THE INVENTION

The disadvantages of the prior art are overcome by the present invention which, in one aspect, is a hybrid solar and mechanical power generator that includes a solar power generating portion and a piezoelectric nanowire vibrational power generating portion. The solar power generating portion electrically coupled to a first electrode. The piezoelectric nanowire vibrational power generating portion includes an electrical contact structure electrically coupled to and extending downwardly from the first electrode and disposed adjacent to the solar power generating portion. A plurality of piezoelectric semiconductor nanorods extends upwardly from a second electrode that is spaced apart from the first electrode so as to be directed toward the electrical contact structure. The plurality of piezoelectric semiconductor nanorods are configured to release electrons across a Schottky barrier formed between the piezoelectric semiconductor nanorods and the electrical contact structure when mechanical energy is applied to the piezoelectric nanowire vibrational power generating portion.

In another aspect, the invention is a hybrid solar-mechanical power generator that includes a solar power generating portion electrically coupled to a first electrode and a piezoelectric nanowire vibrational power generating portion. The piezoelectric nanowire vibrational power generating portion includes a plurality of piezoelectric semiconductor nanorods extending downwardly from the first electrode and an electrical contact structure electrically coupled to and extending upwardly from a second electrode and spaced apart from the first electrode. The electrical contact structure is disposed so as to be directed toward the plurality of piezoelectric semiconductor nanorods and configured so that when mechanical energy is applied to the piezoelectric nanowire vibrational power generating portion the piezoelectric semiconductor nanorods contact the electrical contact structure and the nanorods release electrons across a Schottky barrier formed between the piezoelectric semiconductor nanorods and the electrical contact structure.

In another aspect, the invention is a solar power element that includes an optical fiber. A conductive outer cladding surrounds the optical fiber. A plurality of nanorods extends radially outwardly from the conductive outer cladding.

In yet another aspect, the invention is a method of making a hybrid solar and mechanical power generator, in which a conductive material layer is applied to a first substrate. A nanorod seed material is applied to a portion of both the conductive layer and to the first substrate. A first plurality of nanorods is grown from the nanorod seed material. A liquid is applied to the nanorods grown from the substrate. The liquid is a liquid that will cause nanorods in contact therewith to agglomerate into a plurality of pointed structures.

A metal layer is applied to the pointed structures. A second plurality of nanorods is grown from a second substrate. The second substrate is disposed so as to be parallel to the first substrate and so that the second plurality of nanorods extends toward the plurality of pointed structures. A flexible spacer is placed between the first substrate and the second substrate.

These and other aspects of the invention will become apparent from the following description of the preferred embodiments taken in conjunction with the following drawings. As would be obvious to one skilled in the art, many variations and modifications of the invention may be effected without departing from the spirit and scope of the novel concepts of the disclosure.

DETAILED DESCRIPTION OF THE INVENTION

A preferred embodiment of the invention is now described in detail. Referring to the drawings, like numbers indicate like parts throughout the views. As used in the description herein and throughout the claims, the following terms take the meanings explicitly associated herein, unless the context clearly dictates otherwise: the meaning of "a," "an," and "the" includes plural reference, the meaning of "in" includes "in" and "on."

Figure 1:
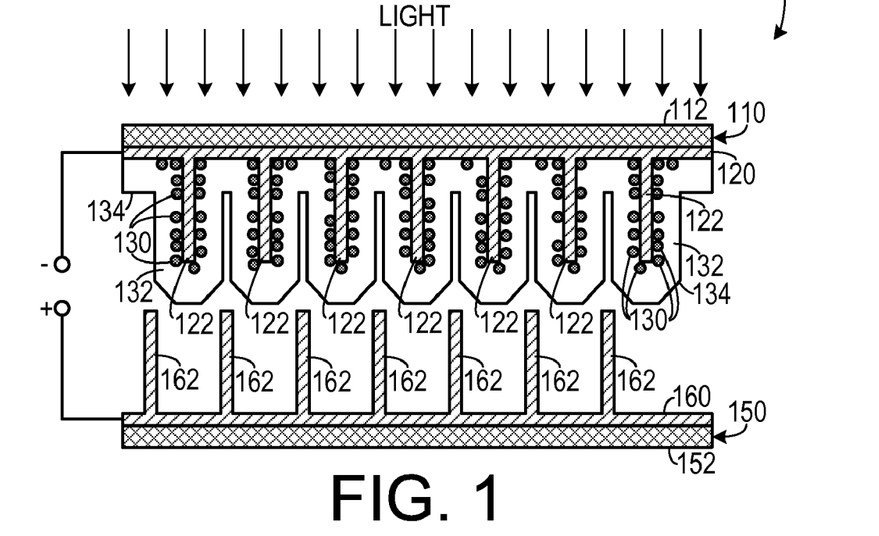
FIG. 1 is a schematic elevational view of a first representative embodiment of a hybrid solar and mechanical electrical power generator.

As shown in FIG. 1, one embodiment of a hybrid solar and mechanical power generator 100 includes a dye-sensitized solar power generating portion 110 that is electrically coupled to a first electrode 120. The solar power generating portion 110 includes a transparent substrate 112 (such as an ITO substrate) affixed to the first electrode 120. A plurality of semiconductor nanorods 122 (such as ZnO nanorods), also referred to as "nanowires," extend from the first electrode. A light absorbing material having a predetermined optical absorption range is applied to the plurality of nanorods 122. In one embodiment, the light absorbing material includes a plurality of ruthenium-based dye particles 130, such as cis-bis(isothiocyanato) bis(2,2'-bipyridyl-4,4'-dicarboxylato)-ruthenium(II) bis-tetrabutylammonium, also referred to as N719 Dye(B2). The dye particles 130 should have an optical absorption range that includes the wavelengths of light to be converted into electrical energy. The growth of ZnO nanorods is disclosed in more detail in U.S. patent application Ser. No. 11/608,865, filed on Dec. 11, 2006 by Wang et al. and U.S. Pat. No. 7,220,310, issued on May 22, 2007 to Wang et al. and U.S. Pat. No. 7,351,607, issued on Apr. 1, 2008 to Wang et al., the entirety of each of which is hereby incorporated by reference. The nanorods 122 can be grown, for example, by physical vapor deposition process or with a wet chemical process.

A transparent housing 134 (which can include a layer of a metal such as gold) surrounds the nanorods 122 and an electrolyte 132 (such as an iodide based electrolyte) is disposed in the housing 134 and the nanorods 122. The housing 134 acts as an electrical contact structure that is electrically coupled to the first electrode 120.

A piezoelectric nanowire vibrational power generating portion 150 is disposed parallel to the solar power generating portion 110. The piezoelectric nanowire vibrational power generating portion 150 includes a second transparent substrate 152 (such as an ITO substrate) and a plurality of aligned piezoelectric semiconductor nanorods 162 (such as ZnO nanorods) extending upwardly from a second electrode 160, which are directed toward the housing 134.

The solar power generating portion 110 is positioned relative to the vibrational power generating portion 150 so that the electrical contact structure 120 contacts the piezoelectric semiconductor nanorods 162 when mechanical force is applied to either portion (e.g., due to vibrational energy being applied thereto), the piezoelectric semiconductor nanorods 162 will contact the housing 134 and bend. Once bent, the piezoelectric semiconductor nanorods 162 will release electrons across a Schottky barrier formed between the piezoelectric semiconductor nanorods 162 and the housing 134.

Figure 2A:
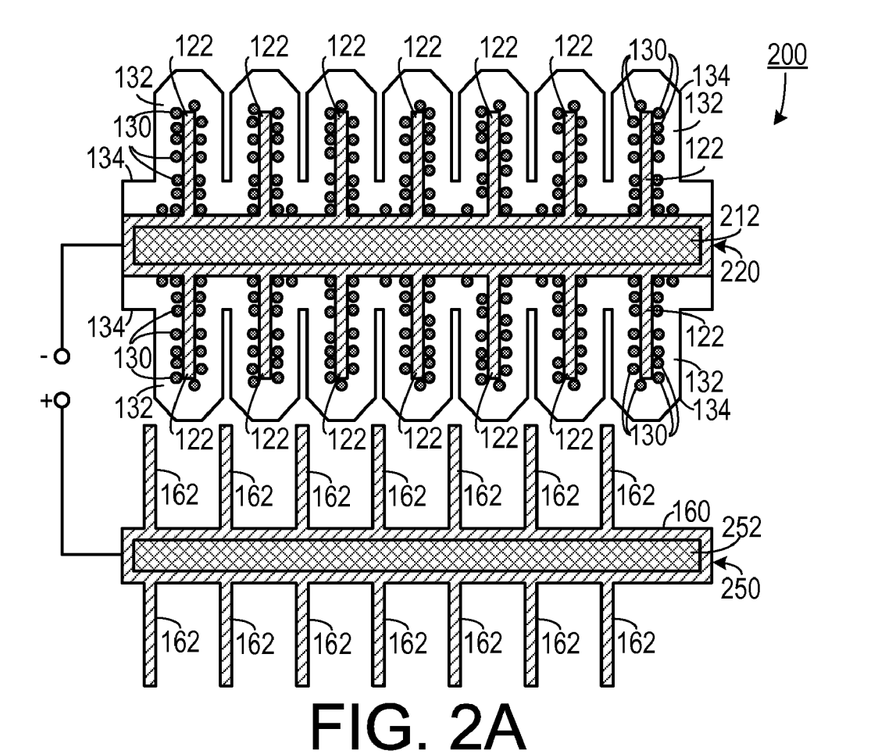
FIG. 2A is a schematic elevational view of a second representative embodiment of a hybrid solar and mechanical electrical power generator.
Figure 2B:
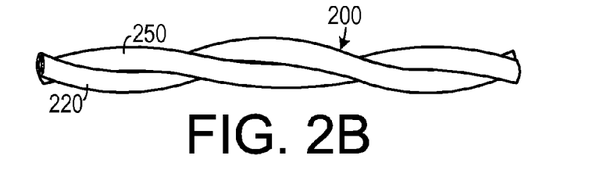
FIG. 2B is a schematic elevational view of an embodiment disposed on textile threads and intertwined.

As shown in FIGS. 2A and 2B, in one embodiment the solar power generating portion 220 may be mounted on a first textile fiber 212 and the piezoelectric nanowire vibrational power generating portion 250 may be mounted on a second textile fiber 252 that is intertwined with the first textile fiber 212. In this design, the relative movement of the two fibers 220 and 250 will generate electricity due to the principle of piezo-electronics. Meanwhile, shining of light will excite the solar cell portion on the back of the contact region to generate electricity as well. These fibers can also be interwoven into a fabric.

Figure 3A:
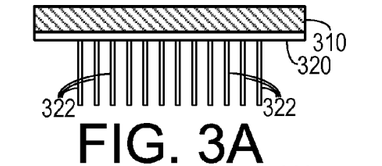
FIGS. 3A-3G are schematic diagrams demonstrating a first method of assembling a hybrid solar and mechanical electrical power generator.
Figure 3B:
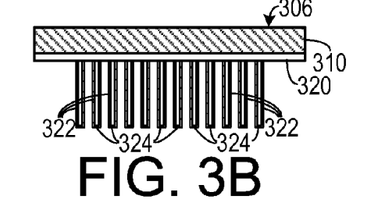

As shown in FIGS. 3A-3G, one method of making a hybrid solar and mechanical power generator 300. Initially, as shown in FIG. 3A, a plurality of nanorods 322 is grown from an electrode 320 affixed to a transparent substrate 310. The nanorods 322 are then coated with a layer 322 of dye molecules, as shown in FIG. 3B, to form a solar collecting unit 306.

Figure 3C:
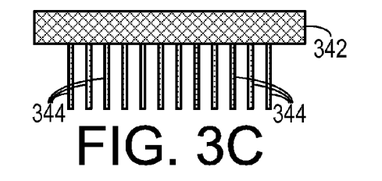
Figure 3D:
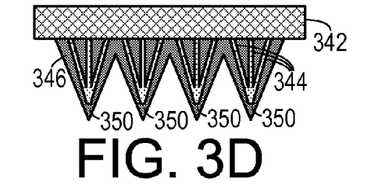
Figure 3E:
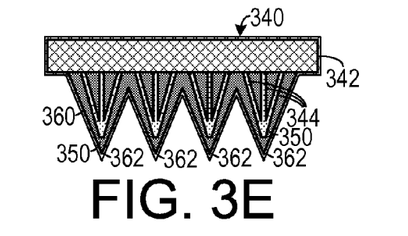

As shown in FIG. 3C, a second plurality of nanorods 344 is grown from a substrate 342. An electrolyte 346, such as a p-type polymer, is then applied to bury the nanorods 344. As shown in FIG. 3D, due to the high aspect ratio of the nanorods, pyramid-shaped extrusions 350 form as a result of the addition of the electrolyte 346. As shown in FIG. 3E, a metal layer 360 (such as a layer of gold, or any other metal that can form a Schottky junction with ZnO) is deposited on the electrolyte pyramid-shaped extrusions 350, thereby forming an array 340 of conductive extrusions 362. The metal layer 360 plays two roles: it acts as a cathode of the solar portion and as an electron collector for the piezoelectric nanogenerator portion.

Figure 3F:
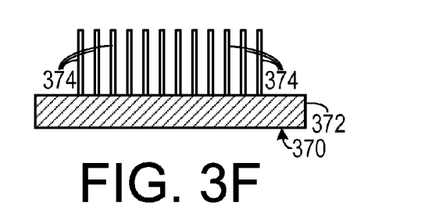

As shown in FIG. 3F, a third plurality of nanorods 374 is grown from a substrate 372. These form a piezoelectric semiconducting nanorod unit 370.

Figure 3G:
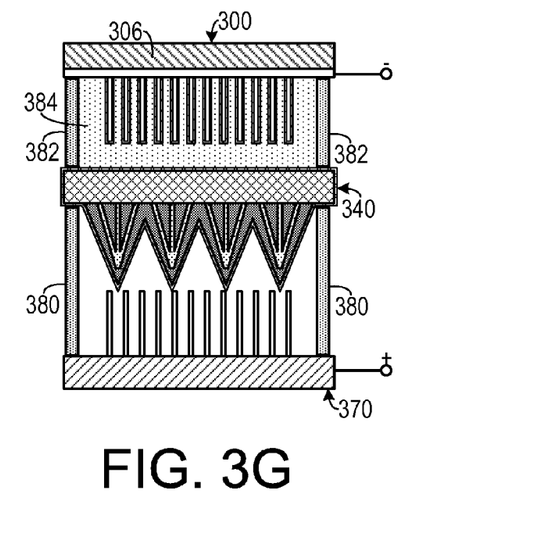

The hybrid generator 300 is then assembled by stacking the array 340 of conductive extrusions 362 on top of the piezoelectric semiconducting nanorod unit 370, separating the with a spacer 380, and placing the solar collecting unit 306 on the array 340 of conductive extrusions 362, separating them with sealing spacer 382 and then injecting an electrolyte 384 into the solar collecting unit 306. Alternately, the electrolyte 384 is applied to the solar collecting unit 306 prior to the application of the sealing spacer 382.

In an alternate embodiment, as shown in FIGS. 4A-4F, a hybrid generator 440 can be formed by generating a solar collecting unit 306 as described above. A mechanical piezoelectric nanorod unit 400 is generated by growing a plurality of nanorods 412 from a substrate 410 and coating the substrate 410 with a conductive layer 414 (such as a metal, e.g., gold or platinum). The solar unit 306 is placed above the mechanical piezoelectric nanorod unit 400 and separated by a sealing spacer 380 and an electrolyte 382 is injected into the solar collecting unit 306.

Figure 4A:
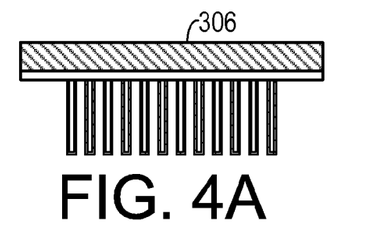
FIGS. 4A-4F are schematic diagrams demonstrating a second method of assembling a hybrid solar and mechanical electrical power generator.
Figure 4B:
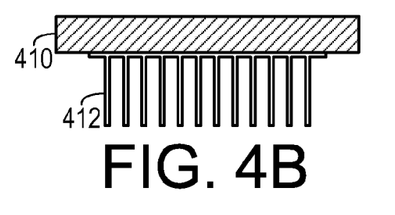
Figure 4C:
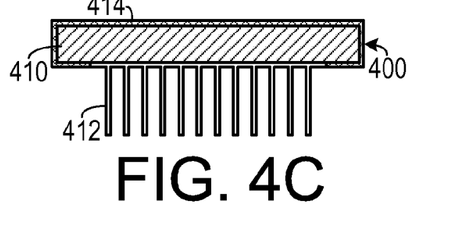
Figure 4D:
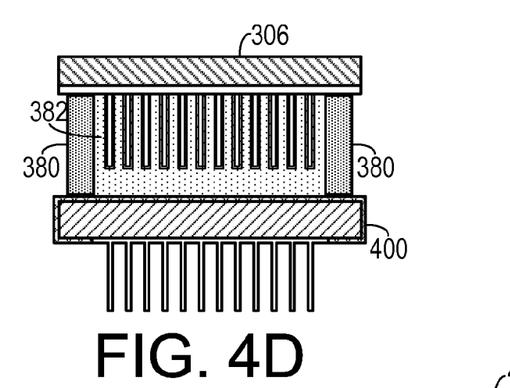
Figure 4E:
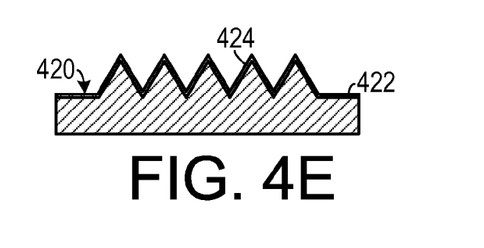
Figure 4F:
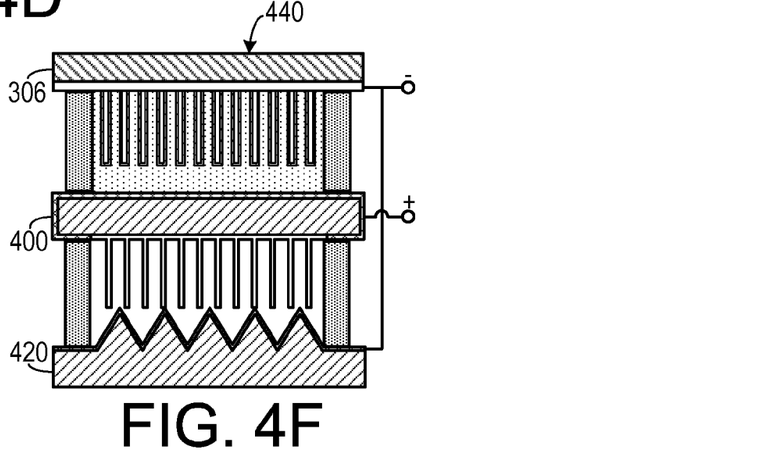

A corrugated contact unit 420, as shown in FIG. 4E, is generated by patterning a substrate 122 with a plurality of corrugations (such as an array of pyramids, an array of trenches, an array of corrugations, an array of crenulations, an array of nano-bowls or combinations thereof) and depositing a metal layer 424 thereon. The solar collecting unit 306, the mechanical piezoelectric nanorod unit 400 and the corrugated contact unit 420 are then stacked upon each other, as shown in FIG. 4F.

Figure 5A:
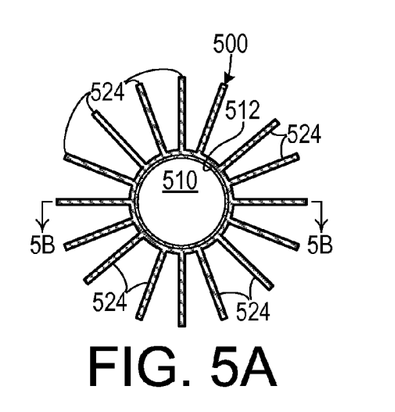
FIG. 5A is a top plan view of a fiber-mounted solar power generator.
Figure 5B:
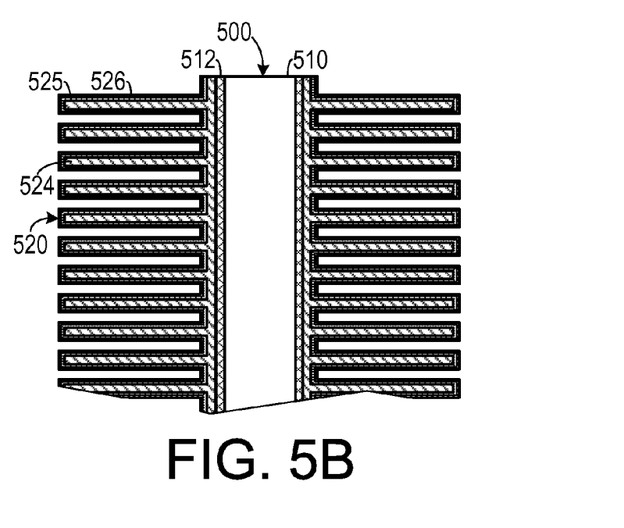
FIG. 5B is a cross-sectional view of the fiber-mounted solar power generator shown in FIG. 5A, taken along line 5B-5B.

As shown in FIGS. 5A and 5B, in one embodiment of a fiber photovoltaic collector 500, an electrode layer 512 (such as ITO) can be applied to an optical fiber 510 (such as an $SiO_2$ optical fiber) and a plurality of nanorods 524 can be grown radially outwardly therefrom. If the nanorods 524 are made of ZnO, then they act as an n-type semiconductor. In certain embodiments, the nanorods could be made of such materials as ZnO, ZnS, Si, GaN, GaInP, GaInAs, Ge, and combinations thereof. As shown in FIG. 5B, the nanorods 524 can be coated with a p-type direct gap semiconducting layer 525 (such as a $Cu_2O$, $Cu_2S$ and $CuInS_2$) and then a metal layer 526 (such as a layer of gold, platinum, or combinations thereof) may be applied to form a plurality of photovoltaic elements 520.

One potential problem with processing a solar cell on a fiber is the inherent lack of surface area of a cylindrical body. In order to reduce the surface area limitations, nanorods 524 which have a high surface-area-to-volume ratio, are grown radially around the optical fiber 510. The optical fiber 510 is used to transmit light, while the nanorods 524 around the fibers serve to increase the surface area to which light is exposed.

In this way, light entering the optical fiber 512 from the tip propagates through the fiber 512 until it reaches a nanorod 524, at which point it causes $e^--h^+$ pairs to be created, separated, and captured by an external circuit. Light entering the optical fiber 512 cannot escape until it interacts with a photovoltaic element, thereby increasing the solar conversion efficiency. In an ordinary thin film, flat substrate-type solar cell, some incident light is reflected before it can create $e^--h^+$, pairs causing efficiency loss. A fiber optic design solves this problem, and it allows a volume-based three dimensional structure to absorb substantially more solar energy.

Figure 5C:
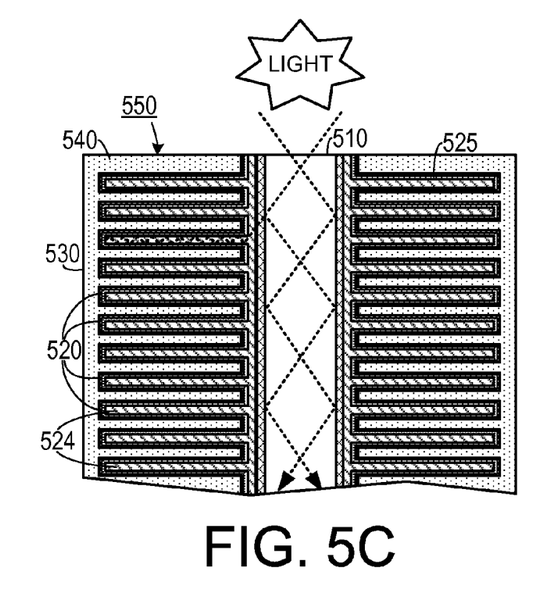
FIG. 5C is a cross-sectional view of an encapsulated fiber-mounted solar power generator.

As shown in FIG. 5C, the photovoltaic elements 520 can be encapsulated in an elongated conductive cladding or housing 530 (such as a platinum coated housing) that serves as a back electrode and also encapsulates an iodide based electrolyte 540, thereby forming a tubular photovoltaic collector 550. In this embodiment, light reflects along the walls of the optical fiber 510 until it enters one of the nanorods 524 and hits the junction of the ZnO nanorod 524, thereby creating an $e^--h^+$ pair. One of the advantages of this embodiment is that light only needs to enter through an end of the fiber 510, but is trapped until it acts with one of the photovoltaic elements 520.

Figure 5D:
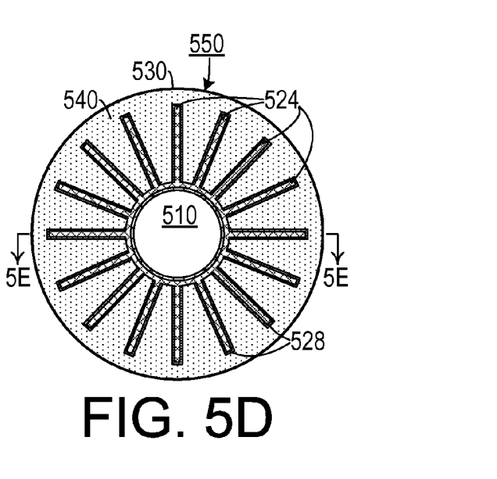
FIG. 5D is a top plan view of a dye-sensitized encapsulated fiber-mounted solar power generator.
Figure 5E:
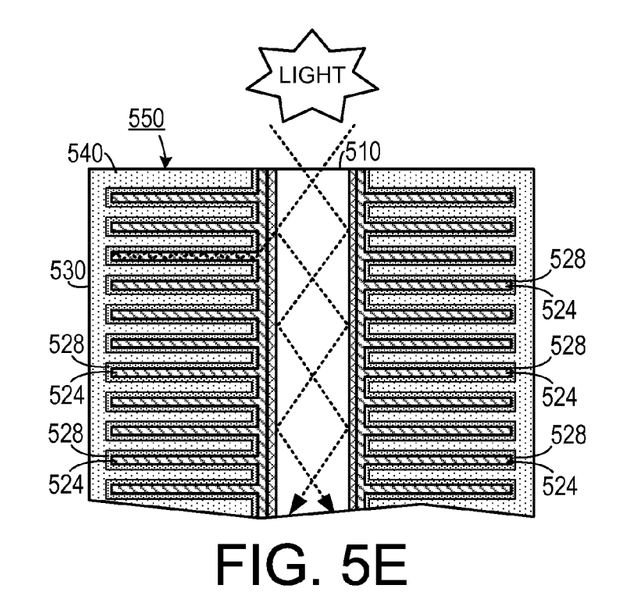
FIG. 5E is a cross-sectional view of the dye-sensitized encapsulated fiber-mounted solar power generator shown in FIG. 5D, taken along line 5E-5E.

As shown in FIGS. 5D and 5E, in one embodiment the photovoltaic elements 520 are dye-sensitized using a layer of dye 528, such as a ruthenium-based dye, applied to the nanorods 524 and then encapsulated in an elongated conductive cladding 530. In this embodiment, light reflects along the walls of the optical fiber 510 until it enters one of the nanorods 524 and hits the junction of the ZnO nanorod 524 and the dye layer 528, thereby creating an $e^--h^+$ pair.

Figure 6:
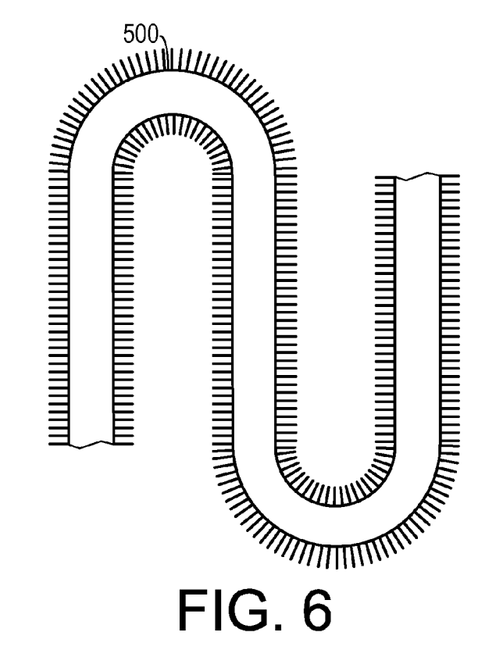
FIG. 6 is an elevational view of a fiber-mounted solar power generator.
Figure 7:
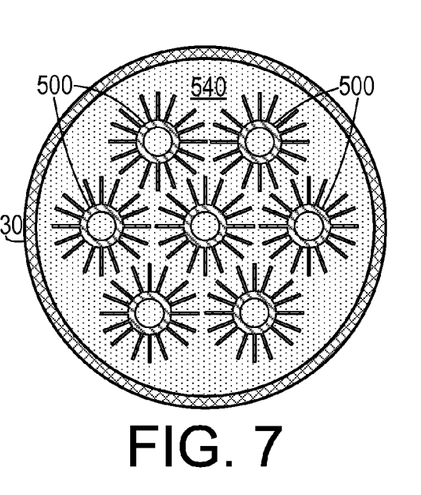
FIG. 7 is a top plan view of a bundle of fiber-mounted solar power generators.
Figure 8:
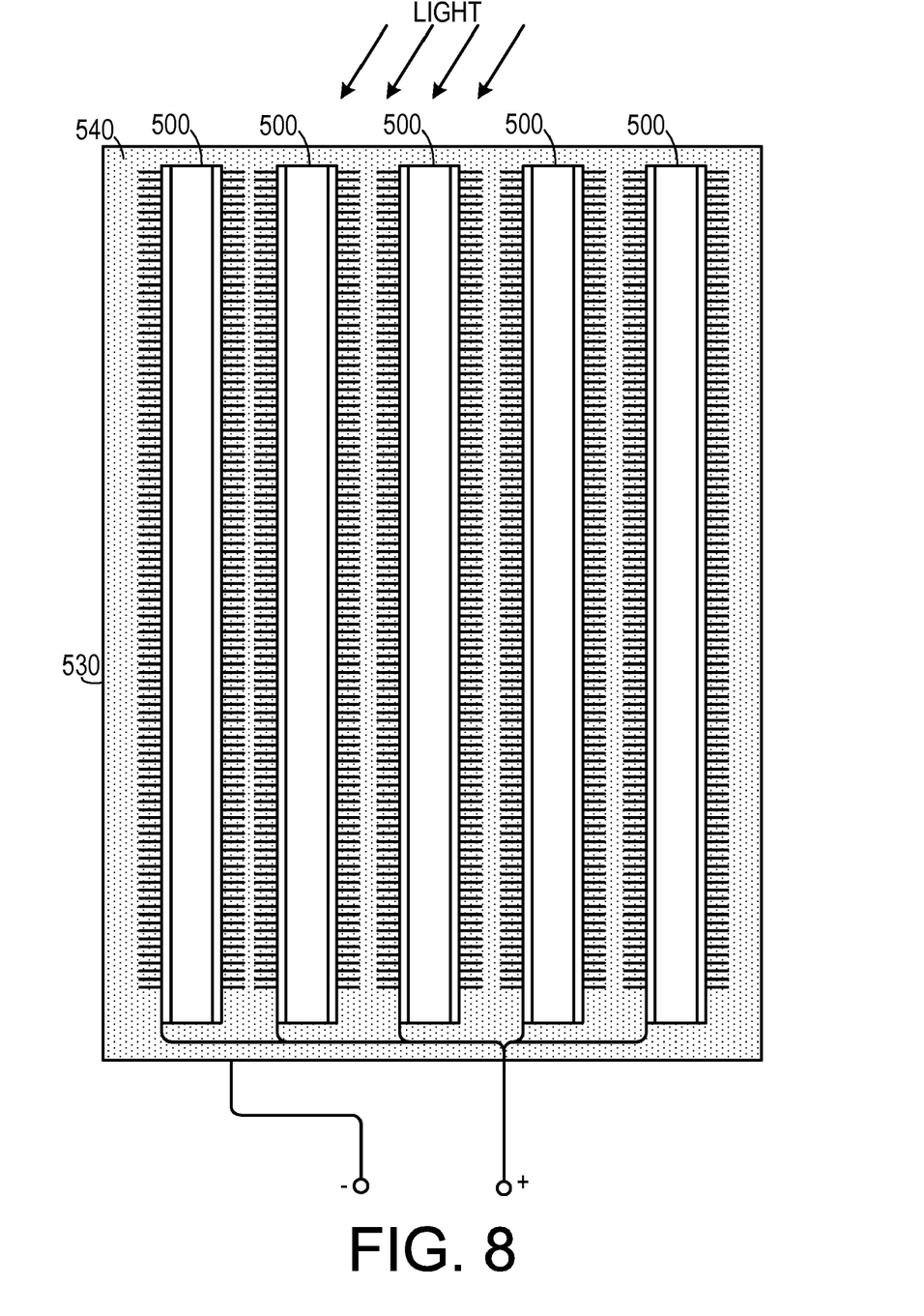
FIG. 8 is an elevational view of an array of fiber-mounted solar power generators.

As shown in FIG. 6, a fiber photovoltaic collector 500 of the type disclosed is flexible and can be adapted to many shapes, while still maintaining a high transmission of light. As shown in FIGS. 7 and 8, several different fiber photovoltaic collectors 500 can be placed together inside a single conductive tubular housing 530 and suspended in an electrolyte 540. This results in a low volume, high energy and high density device. Another potential advantage is that light can be collected from one location and guided to another location for solar energy conversion. For example, the fiber photovoltaic collector 500 can be buried underground in a dark location while the tip is exposed at the surface and directed towards the sun. This could be an important aspect for generating energy in space-confined areas.

When ZnO nanorods are subject to deflection, electrons flow from the nanowire to the metal electrode and back to the bottom of nanorods. In the hybrid system, they are sharing the metal electrode. Therefore, the negative electrode of the piezoelectric nanogenerator is directly connected to the positive electrode of the solar cell. These two types of electricity generators can thus be considered as in a serial connection. When functioning together, their outputs add up. When there is only one part working due to the restriction of circumstance, the other part will just be a path for the current flow. The combining of solar cell and piezoelectric nanogenerator will largely enhance the power generation efficiency of a simple piezoelectric nanogenerator or solar cell. Moreover, the environmental restriction for their operation will also be largely reduced.

The above described embodiments, while including the preferred embodiment and the best mode of the invention known to the inventor at the time of filing, are given as illustrative examples only. It will be readily appreciated that many deviations may be made from the specific embodiments disclosed in this specification without departing from the spirit and scope of the invention. Accordingly, the scope of the invention is to be determined by the claims below rather than being limited to the specifically described embodiments above.

What is claimed is:

1. A hybrid solar and mechanical power generator, comprising:
   a. a solar power generating portion electrically coupled to a first electrode; and
   b. a piezoelectric nanowire vibrational power generating portion including:
      i. an electrical contact structure electrically coupled to and extending downwardly from the first electrode and disposed adjacent to the solar power generating portion; and
      ii. a plurality of piezoelectric semiconductor nanorods extending upwardly from a second electrode, spaced apart from the first electrode, so as to be directed toward the electrical contact structure and configured to release electrons across a Schottky barrier formed between the piezoelectric semiconductor nanorods and the electrical contact structure when mechanical energy is applied to the piezoelectric nanowire vibrational power generating portion.

2. The hybrid solar and mechanical power generator of claim 1, wherein the solar power generating portion comprises:
   a. a plurality of semiconductor nanorods extending outwardly from the first electrode;
   b. a light absorbing material having a predetermined optical absorption range applied to the plurality of nanorods;
   c. a transparent housing surrounding the nanorods; and
   d. an electrolyte disposed in the housing and surrounding the nanorods.

3. The hybrid solar and mechanical power generator of claim 2, wherein the light absorbing material comprises a dye.

4. The hybrid solar and mechanical power generator of claim 3, wherein the dye comprises a ruthenium-based dye.

5. The hybrid solar and mechanical power generator of claim 2, wherein the plurality of semiconductor nanorods depend downwardly from the first electrode.

6. The hybrid solar and mechanical power generator of claim 2, wherein the plurality of semiconductor nanorods extend upwardly from the first electrode.

7. The hybrid solar and mechanical power generator of claim 2, wherein the electrolyte comprises an iodide based electrolyte.

8. The hybrid solar and mechanical power generator of claim 2, wherein the housing comprises a layer of a metal.

9. The hybrid solar and mechanical power generator of claim 1, wherein the electrical contact structure comprises a conductive housing depending downwardly from the first electrode.

10. The hybrid solar and mechanical power generator of claim 9, wherein the conductive housing comprises a layer of a metal.

11. The hybrid solar and mechanical power generator of claim 1, wherein the solar power generating portion is mounted on a first textile fiber and wherein the piezoelectric nanowire vibrational power generating portion is mounted on a second textile fiber that is intertwined with the first textile fiber.

12. The hybrid solar and mechanical power generator of claim 11, further comprising a fabric including a plurality of first textile fibers, each first textile fiber supporting a solar power generating portion, interwoven with a plurality of second textile fibers, each second textile fiber supporting a piezoelectric nanowire vibrational power generating portion.

13. A hybrid solar-mechanical power generator, comprising:
   a. a solar power generating portion electrically coupled to a first electrode; and
   b. a piezoelectric nanowire vibrational power generating portion including:
      i. a plurality of piezoelectric semiconductor nanorods extending downwardly from the first electrode; and
      ii. an electrical contact structure electrically coupled to and extending upwardly from a second electrode, spaced apart from the first electrode, disposed so as to be directed toward the plurality of piezoelectric semiconductor nanorods and configured so that when mechanical energy is applied to the piezoelectric nanowire vibrational power generating portion the piezoelectric semiconductor nanorods contact the electrical contact structure and the nanorods release electrons across a Schottky barrier formed between the piezoelectric semiconductor nanorods and the electrical contact structure.

14. The hybrid solar-mechanical power generator of claim 13, wherein the electrical contact structure comprises a conductive material.

15. The hybrid solar-mechanical power generator of claim 13, wherein the electrical contact structure comprises a surface having a topography selected from a group consisting of: an array of pyramids, an array of trenches, an array of corrugations, an array of crenulations, and combinations thereof.

16. A method of making a hybrid solar and mechanical power generator, comprising the actions of:
   a. applying a conductive material layer to a first substrate;
   b. applying a nanorod seed material to a portion of both the conductive layer and to the first substrate;
   c. growing a first plurality of nanorods from the nanorod seed material;
   d. applying a liquid to the nanorods grown from the substrate, the liquid being a liquid that will cause nanorods in contact therewith to agglomerate into a plurality of pointed structures;
   e. applying a metal layer to the pointed structures;
   f. growing a second plurality of nanorods from a second substrate;
   g. disposing the second substrate so as to be parallel to the first substrate and so that the second plurality of nanorods extend toward the plurality of pointed structures; and
   h. placing a flexible spacer between the first substrate and the second substrate.

17. The method of claim 16, wherein the conductive material layer comprises ITO.

18. The method of claim 16, wherein the nanorods comprise a material selected from a group consisting of: ZnO, Si, CIGS, GaInP, GaInAs, Ge and combinations thereof.

19. The method of claim 16, further comprising the actions of:
   a. placing an optically transparent housing over the conductive material layer and the nanorods of the first plurality of nanorods extending therefrom;
   b. applying a dye having a predetermined optical absorption range to the nanorods disposed in the optically transparent housing;
   c. placing an electrolyte in the optically transparent housing; and
   d. sealing the optically transparent housing to the conductive material layer.

20. The method of claim 19, wherein the dye comprises a ruthenium-based dye.

21. The method of claim 19, wherein the electrolyte comprises an iodide based electrolyte.

* * * * *